(12) United States Patent
Yoo

(10) Patent No.: US 9,466,360 B2
(45) Date of Patent: Oct. 11, 2016

(54) SEMICONDUCTOR DEVICE AND METHOD OF OPERATING THE SAME

(71) Applicant: SK hynix Inc., Gyeonggi-do (KR)

(72) Inventor: Deung Kak Yoo, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/528,636

(22) Filed: Oct. 30, 2014

(65) Prior Publication Data

US 2015/0364185 A1    Dec. 17, 2015

(30) Foreign Application Priority Data

Jun. 12, 2014  (KR) .................. 10-2014-0071545

(51) Int. Cl.
*G11C 16/04* (2006.01)
*G11C 11/56* (2006.01)

(52) U.S. Cl.
CPC ........ *G11C 11/5635* (2013.01); *G11C 11/5628* (2013.01); *G11C 16/0483* (2013.01)

(58) Field of Classification Search
CPC .......... G11C 11/5628; G11C 11/5642; G11C 16/10; G11C 11/56; G11C 11/5621; G11C 16/26; G11C 16/3459
USPC .......................... 365/185.03, 185.24, 185.29
See application file for complete search history.

(56) References Cited

U.S. PATENT DOCUMENTS

| 2012/0099375 A1* | 4/2012 | Choi ................. G11C 16/0483 365/185.11 |
| 2014/0146609 A1* | 5/2014 | Avila .................... G11C 16/04 365/185.17 |

FOREIGN PATENT DOCUMENTS

KR             101001516        12/2010

* cited by examiner

*Primary Examiner* — Huan Hoang
(74) *Attorney, Agent, or Firm* — IP & T Group LLP

(57) ABSTRACT

A method of operating a semiconductor device includes performing a program operation on selected memory cells of a selected page, and selectively performing a soft erase operation on memory cells having threshold voltages greater than a reference voltage, among the selected memory cells, to reduce a width of a threshold voltage distribution of the selected memory cells.

20 Claims, 14 Drawing Sheets

FIG. 9
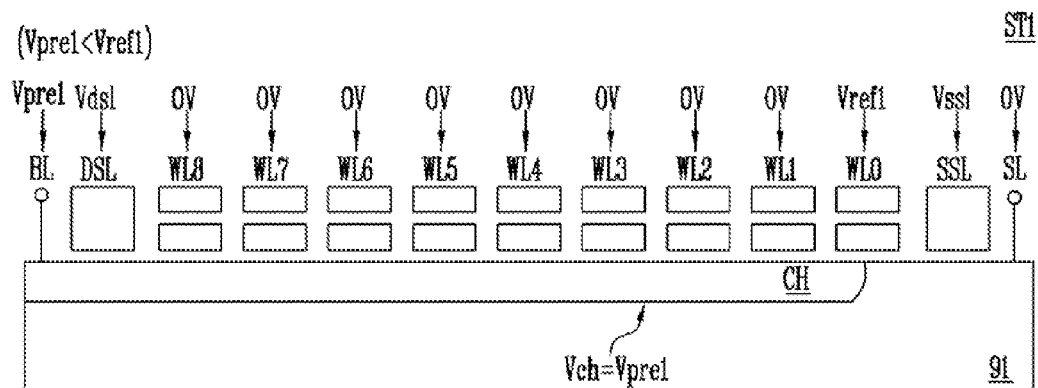
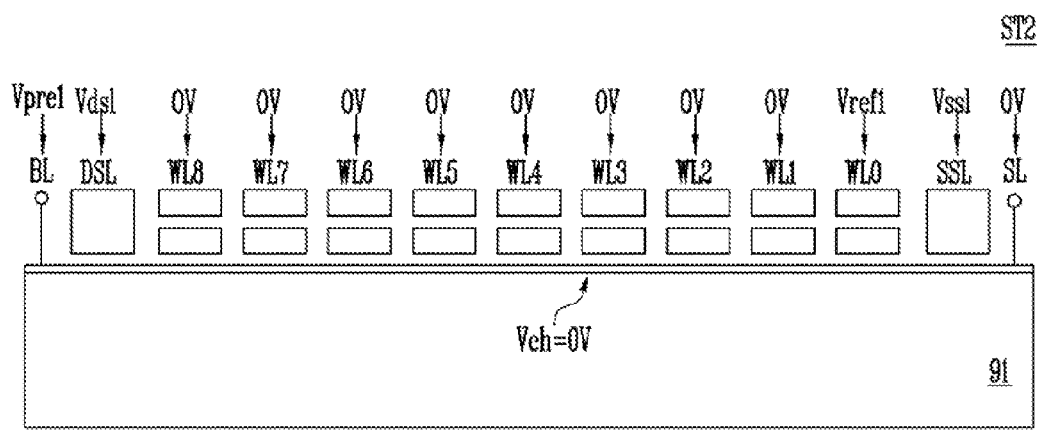

FIG. 12
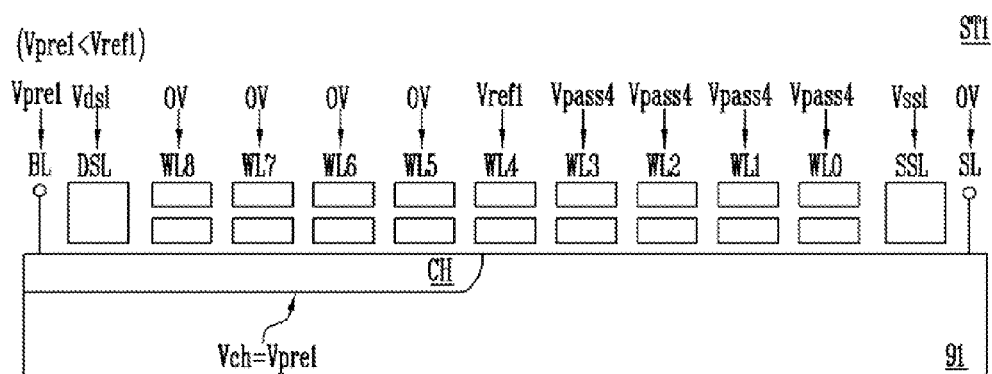
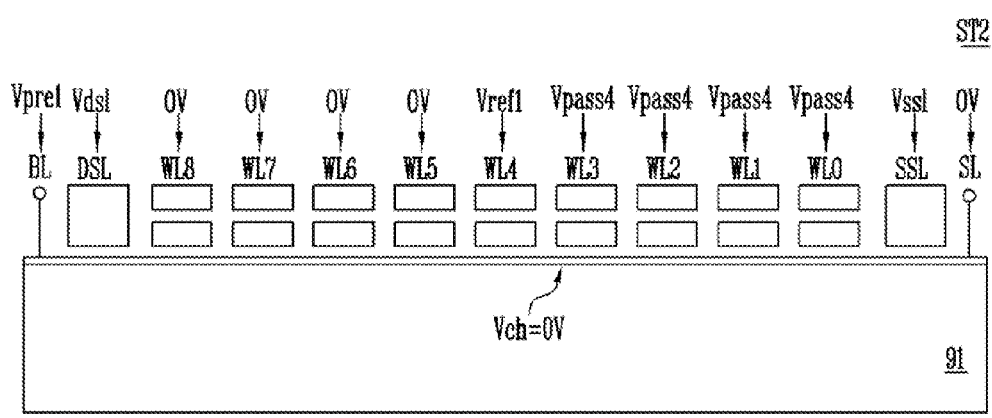

SEMICONDUCTOR DEVICE AND METHOD OF OPERATING THE SAME

CROSS-REFERENCE TO RELATED APPLICATION

The present application claims priority to Korean patent application number 10-2014-0071545, filed on Jun. 12, 2014, the entire disclosure of which is incorporated herein in its entirety by reference.

BACKGROUND

1. Field of Invention

Various exemplary embodiments of the present invention relate generally to a semiconductor device and a method of operating the same, and more particularly, to a program method of the semiconductor device.

2. Description of Related Art

A semiconductor memory includes a memory cell array in which data is stored. The memory cell array includes a plurality of memory blocks, and each of the memory blocks includes a plurality of cell strings. The cell strings are coupled between a common source line and bit lines. For example, the cell strings are coupled in common to a common source line, and the bit lines are coupled to the cell strings, respectively. Each of the cell strings includes a source select transistor, a plurality of memory cells and a drain select transistor. A source of the source select transistor is coupled to the common source line, and a drain of the drain select transistor is coupled to a bit line. The plurality of memory cells are connected between the source select transistor and the drain select transistor.

A multi-level cell (MLC), which is a single memory cell programmed into one of a plurality of program states, has been widely used. For example, a multi-level cell is programmed into an erase state, a first program state, a second program state, or a third program state depending on a threshold voltage thereof. In addition to the multi-level cell, a triple level cell (TLC) which is a single memory cell programmed into one of more program states than the multi-level cell has gained attention.

As for the multi-level cell or the triple level cell, since a memory cell is programmed into one of a plurality of program states, the reliability of the memory cell may be increased as the voltage difference between threshold voltage distributions corresponding to the respective program states is increased. In addition, as the threshold voltage distribution of programmed memory cells widens, the threshold voltage distribution is more likely to overlap with other threshold voltage distributions of memory cells programmed into different program states. Therefore, different data may be read during a read operation, and the reliability of the semiconductor device may be reduced.

SUMMARY

Exemplary embodiments of the present invention are directed to a semiconductor device which programs memory cells to have a reduced threshold voltage distribution width, and an operating method thereof.

A method of operating a semiconductor device according to an embodiment of the present invention may include performing a program operation on selected memory cells of a selected page, and selectively performing a soft erase operation on memory cells having threshold voltages greater than a reference voltage, among the selected memory cells, to reduce the threshold voltage distribution width of the selected memory cells.

A method of operating a semiconductor device according to an embodiment of the present invention may include programming selected memory cells, among a plurality of memory cells formed between first selection transistors and second selection transistors on a substrate, wherein threshold voltages of the selected memory cells have higher levels than a target level, forming channels on the substrate, and selectively increasing potential differences between the channels and the selected memory cells to reduce threshold voltages of memory cells, which have a higher level than a reference level, among programmed memory cells.

A semiconductor device according to an embodiment of the present invention may include a memory block including a plurality of cell strings each including a first selection transistor, a plurality of memory cells and a second selection transistor coupled in series between bit lines and a common source line, a circuit group suitable for performing a program operation and a soft erase operation on the memory block, and a control circuit suitable for controlling the circuit group to perform the program operation on selected memory cells of a selected page, among a plurality of pages included in the memory block, and selectively perform a soft erase operation on memory cells having greater threshold voltages than a reference voltage, among the selected memory cells, when the program operation is completed.

BRIEF DESCRIPTION OF THE DRAWINGS

FIG. 9 is a view illustrating changes in a channel when a program operation is performed according to an embodiment of the present invention;

FIG. 12 is a view illustrating changes in a channel when a program operation is performed according to an embodiment of the present invention;

DETAILED DESCRIPTION

Figure 1:
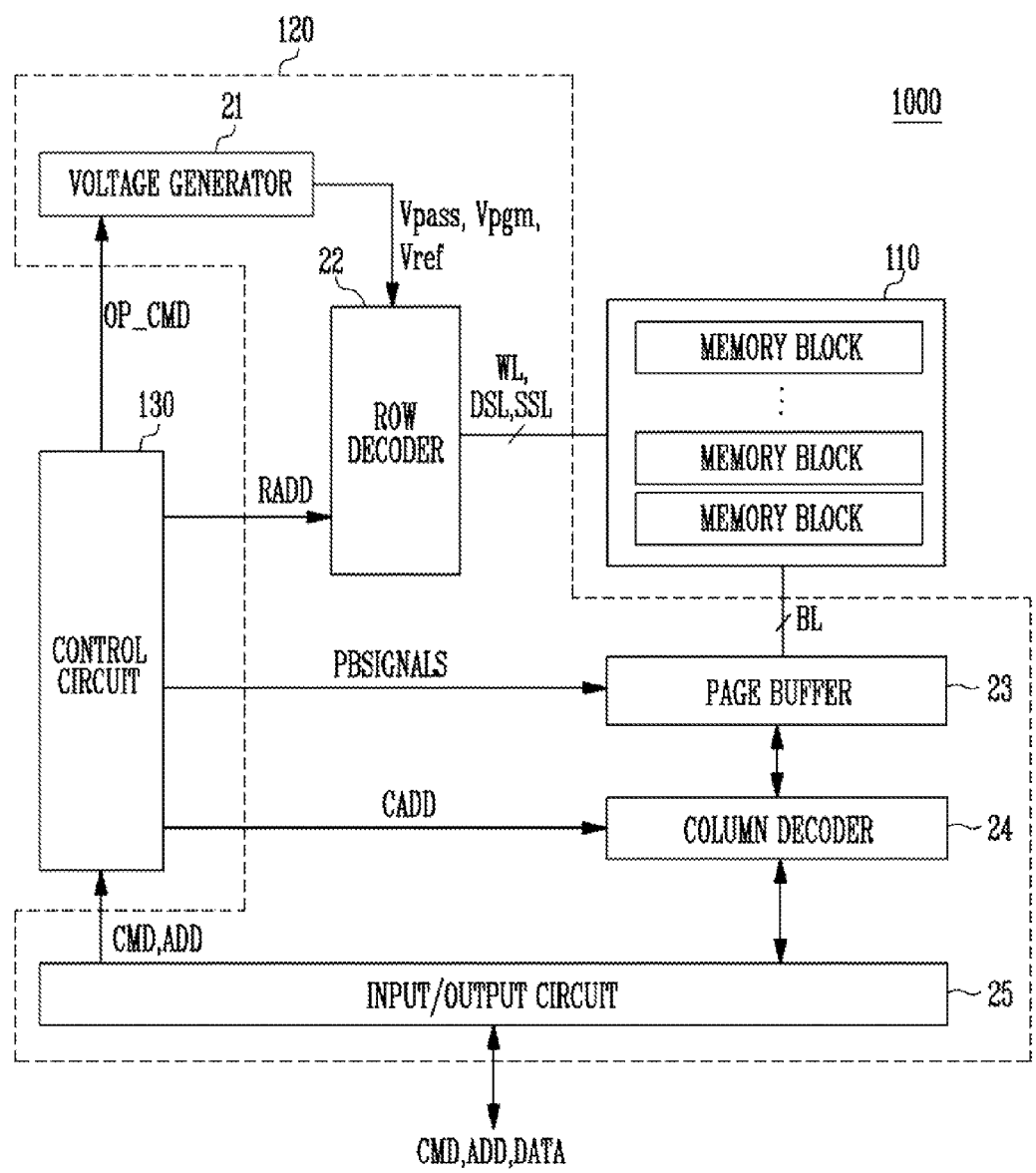
FIG. 1 is a block diagram illustrating a semiconductor device according to an embodiment of the present invention.

Hereinafter, various embodiments of the present invention will be described in detail with reference to the accompanying drawings. The figures are provided to enable those of ordinary skill in the art to make and use the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals correspond directly to the like numbered parts in the various figures and embodiments.

In this specification, a singular form may include a plural form as long as it is not specifically mentioned. Furthermore, 'include/comprise' or 'including/comprising' used in the specification represents that one or more components, steps, operations, and elements exists or are added.

FIG. 1 is a block diagram illustrating a semiconductor device according to an embodiment of the present invention.

Referring to FIG. 1, a semiconductor device 1000 may include a memory cell array 110 for storing data, a circuit group 120 for performing program, read and erase operations on the memory cell array 110, and a control circuit 130 for controlling the circuit group 120.

The memory cell array 110 may include a plurality of memory blocks. The memory blocks may have substantially the same configuration. The configuration of each memory block is described below in detail with reference to FIG. 2.

The circuit group 120 may include a voltage generator 21, a row decoder 22, a page buffer 23, a column decoder 24 and an input/output circuit 25.

The voltage generator 21 may generate operating voltages having various levels in response to an operating command signal OP_CMD. The operating command signal OP_CMD may include a program command signal, a read command signal and an erase command signal. For example, the voltage generator 21 may generate a program voltage Vpgm, a pass voltage Vpass, a reference voltage Vref, and other voltages having various levels. The program voltage Vpgm may be applied to a selected word line during a program operation of a selected memory block. The reference voltage Vref may be applied to the selected word line during a soft erase operation of a selected page, which is performed after the program operation of the selected page is completed. The pass voltage Vpass may be applied to the remaining word lines except the selected word line during the program operation or the soft erase operation. Pass voltages having various levels may be applied based on positions of the word lines.

The row decoder 22 may select one of the memory blocks included in the memory cell array 110 in response to a row address RADD, and transfer the operating voltages to word lines WL, drain selection lines DSL and source selection lines SSL coupled to the selected memory block.

The page buffer 23 may be coupled to the memory blocks through bit lines BL. The page buffer 23 may exchange data with the selected memory block and temporarily store the transferred data in response to page buffer control signals PBSIGNALS during the program, read and erase operations.

The column decoder 24 may exchange data with the page buffer 23 in response to a column address CADD.

The input/output circuit 25 may transfer a command signal CMD and an address ADD from an external device to the control circuit 130, transfer externally provided data DATA to the column decoder 24, and transfer the data DATA from the column decoder 24 to an external device.

The control circuit 130 may output the operating command signal OP_CMD, the row address RADD, the page buffer control signals PBSIGNALS and the column address CADD to control the circuit group 120 in response to the command signal CMD and the address ADD.

When the program operation of the selected page, among a plurality of pages of the selected memory block, is completed during the program operation of the selected memory block, the control circuit 130 may control the circuit group 120 to perform the soft erase operation on the selected page on which the program operation is completed. The soft erase operation may be performed on memory cells having greater threshold voltages than a reference voltage, among the memory cells on which the program operation is completed. Memory cells which have higher threshold voltages than other memory cells, or over-programmed memory cells, among the memory cells on which the program operation is completed, may slightly reduce their threshold voltages by performing the soft erase operation, so that the threshold voltage distribution widths may be reduced.

The configuration of the memory block is described below in detail.

Figure 2:
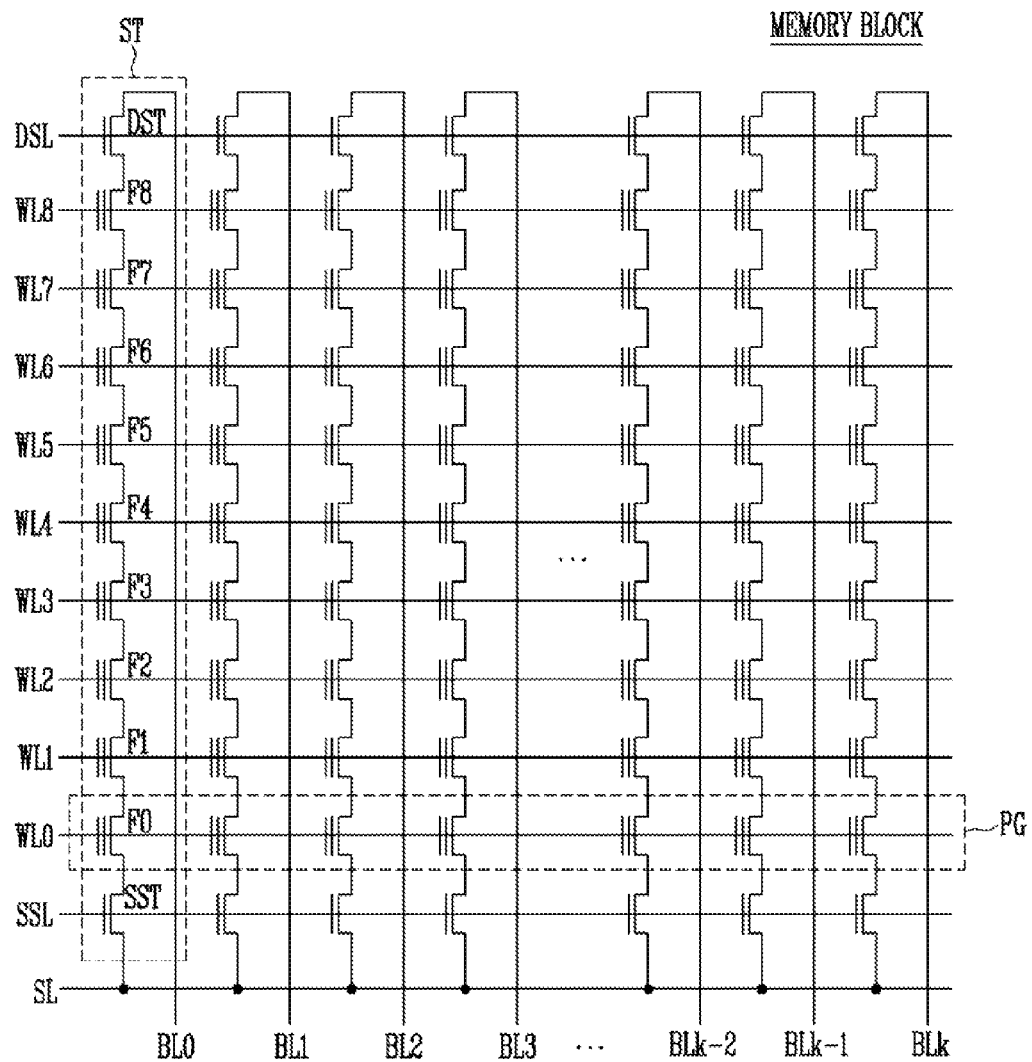
FIG. 2 is a detailed circuit diagram of a memory block shown in FIG. 1.

FIG. 2 is a detailed circuit diagram of the memory block shown in FIG. 1.

Since the memory blocks have substantially the same configuration, one of the memory blocks is described as an example.

Referring to FIG. 2, the memory block may include a plurality of cell strings. The cell strings may be coupled between a common source line SL and bit lines BL0 to BLk. Since the cell strings have substantially the same configuration, one of the cell strings, for example, a cell string ST is described as an example.

The cell string ST may include a source selection transistor SST, 0th to eighth memory cells F0 to F8 and a drain selection transistor DST which are coupled in series between the common source line SL and the bit line BL0. For a simple explanation, nine memory cells F0 to F8 are illustrated. However, more than nine memory cells may be included in semiconductor devices. A source of the source selection transistor SST may be coupled to the common source line SL, and a drain of the drain selection transistor DST may be coupled to the bit line BL0.

Gates of source selection transistors SST included in different cell strings may be coupled to a source selection line SSL. Gates of the 0th to eighth memory cells F0 to F8 may be coupled to 0th to eighth word lines WL0 to WL8. Gates of the drain selection transistor DST included in different cell strings may be coupled to a drain selection line DSL. A group of memory cells coupled to the same word line may be referred to as a page PG. A program operation and a soft erase operation according to an embodiment may be performed in each page as a basic unit.

A program operation of the above-described memory block is described below.

Figure 3:
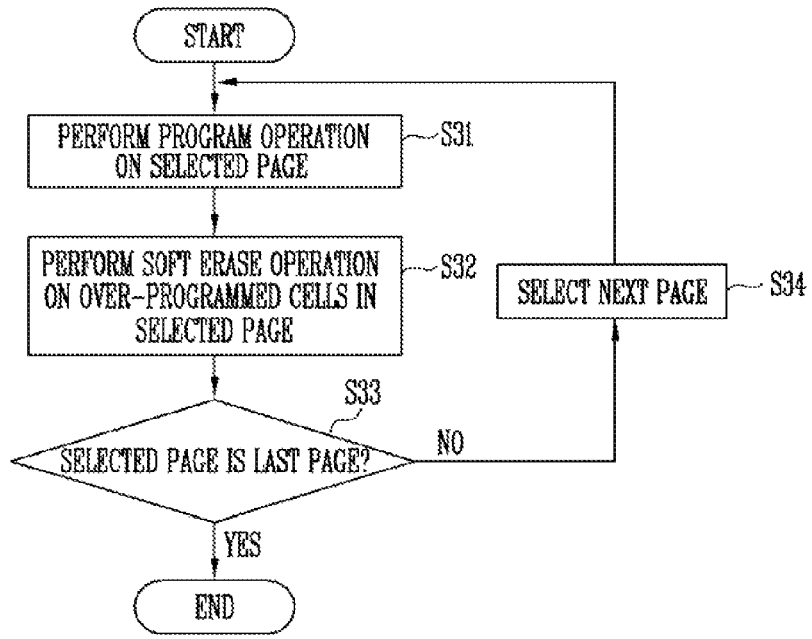
FIG. 3 is a flowchart illustrating a program operation of a semiconductor device according to an embodiment of the present invention.
Figure 4:
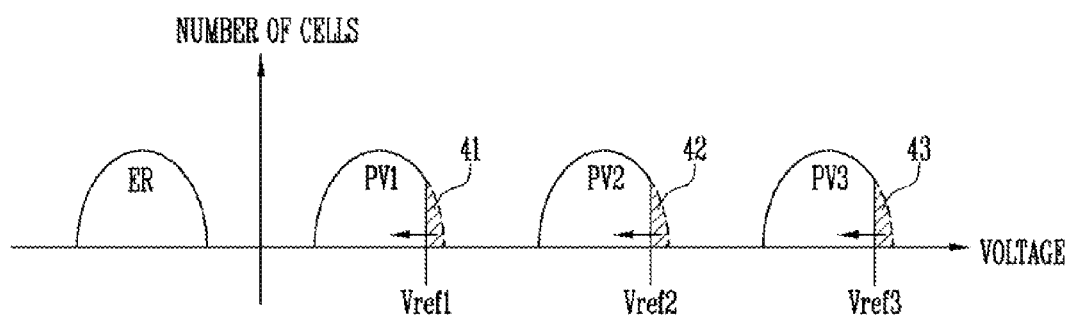
FIG. 4 is a view illustrating widths of threshold voltage distributions of memory cells when a program operation is performed according to an embodiment of the present invention.

FIG. 3 is a flowchart illustrating a program operation according to an embodiment of the present invention. FIG. 4 is a view illustrating a width of a threshold voltage distribution of memory cells during the program operation according to an embodiment of the present invention.

Referring to FIG. 3, a program operation may be performed on a selected page, among a plurality of pages included in a selected memory block, at step S31. The program operation of the selected page may be performed by using an incremental step pulse program (ISPP) method in which a program voltage is gradually increased.

When the program operation of the selected page is completed, a soft erase operation may be performed to reduce threshold voltages of over-programmed memory cells or memory cells which have higher threshold voltages than other memory cells, among selected memory cells included in the selected page on which the program operation is completed, at step S32. Further details thereof are given below.

To complete the program operation of the selected page, the threshold voltages of the selected memory cells included in the selected page are to be higher than a target level. In other words, when the voltage levels of all threshold voltages of the selected memory cells included in the selected page are higher than the target level at step S31, it may be determined that the program operation of the selected page is completed, and the soft erase operation at step S32 may be performed. The threshold voltages of the memory cells are as follows.

A threshold voltage distribution of memory cells is described with reference to FIG. 4.

Referring to FIG. 4, it is described as an example that in a multi-level cell (MLC) program operation, memory cells may have an erase state ER, a first program state PV1, a second program state PV2 or a third program state PV3 on the basis of a threshold voltage distribution. Threshold voltages of memory cells having the first program state PV1 may be greater than those of memory cells having the erase state ER. Threshold voltages of memory cells having the second program state PV2 may be greater than those of the memory cells having the first program state PV1. Threshold voltages of memory cells having the third program state PV3 may be greater than those of the memory cells having the second program state PV2.

The program operation and the soft erase operation of the selected page may be sequentially performed on the memory cells to be programmed into the first program state PV1 and on the memory cells to be programmed into the second program state PV2 and the third program state PV3.

For example, the memory cells to be programmed into the first program state PV1, among the memory cells of the selected page, may be programmed to increase their threshold voltages. When the program operation of the memory cells to be programmed into the first program state PV1 is completed, a soft erase operation may be performed on memory cells having higher threshold voltages than a first reference voltage Vref1. In other words, the soft erase operation may be selectively performed on memory cells having relatively high threshold voltages or over-programmed memory cells 41, among the memory cells programmed into the first program state PV1, so that the threshold voltages thereof may be reduced lower than the first reference voltage Vref1.

The first reference voltage Vref1 may be set to a voltage which is slightly lower than the highest voltage in the threshold voltage distribution of the first program state PV1. For example, when a threshold voltage distribution of the memory cells programmed into the first program state PV1 before the soft program operation is performed is between 2.0V and 3.3V, the first reference voltage Vref1 may be set to 3.0V, which is lower than 3.3V, here, the maximum threshold voltage. However, this is only an example and the first reference voltage Vref1 may vary depending on the particular semiconductor device application.

After the program operation and the soft erase operation of the memory cells programmed into the first program state PV1 in the selected page are completed, a program operation may be performed on memory cells to be programmed into the second program state PV2 in the same page. After the program operation of the memory cells to be programmed into the second program state PV2 is completed, a soft erase operation may be performed on memory cells having higher threshold voltages than a second reference voltage Vref2. In other words, the soft erase operation may be selectively performed on memory cells 42, which have relatively high threshold voltages or are over-programmed, among the memory cells programmed into the second program state PV2, so that the threshold voltages of the memory cells 42 may be reduced lower than the second reference voltage Vref2. The second reference voltage Vref2 may be higher than the first reference voltage Vref1 and lower than the highest voltage in the threshold voltage distribution of the second program state PV2. The second reference voltage Vref2 may vary depending on semiconductor devices.

When the program operation and the soft erase operation of the memory cells programmed into the second program state PV2 in the selected page are completed, a program operation may be performed on memory cells to be programmed into the third program state PV3 in the same page.

When the program operation of the memory cells to be programmed into the third program state PV3 is completed, a soft erase operation may be performed on memory cells having higher threshold voltages than a third reference voltage Vref3. In other words, the soft erase operation may be selectively performed on memory cells 43, which have relatively high threshold voltages or are over-programmed, among the memory cells programmed into the third program state PV3, so that the threshold voltage of the memory cells 43 may be reduced below the third reference voltage Vref3. The third reference voltage Vref3 may be set above the second reference voltage Vref2 and below the highest voltage in the threshold voltage distribution of the third program state PV3. The third reference voltage Vref3 may vary depending on semiconductor devices.

The above-described soft erase operation may be performed using channel boosting of cell strings, unlike the general erase method in which an erase voltage is applied to the bulk of the selected memory block. By performing the soft erase operation, threshold voltages of memory cells, which have relatively high threshold voltages or are over-programmed, among the selected memory cells included in the selected page, may be reduced, so that the width of the threshold voltage distribution of the memory cells included in the selected page may be reduced.

Referring again to FIG. 3, after the soft erase operation of the selected page is completed, it may be determined whether the selected page is the last page of the selected memory block at step S33. As a result of determination, if the selected page is the last page, the program operation of the selected memory block may be completed. As a result of determination, if the selected page is not the last page, a next page on which the program operation is not performed may be selected from the selected memory block at step S34, and a program operation may be performed on the selected page at step S31. Steps S31 to S34 may be repeated until the program operation of every page of the selected memory block is completed.

FIGS. 5 to 8 are views illustrating a program operation according to an embodiment of the present invention. FIGS. 9 to 14 are views illustrating changes in a channel when a program operation is performed according to an embodiment of the present invention.

More specifically, a 0th page adjacent to the source selection line SSL is described as a selected page Sel. PG, in FIGS. 5, 6, and 9 to 11, and a fourth page apart from the source or drain selection line SSL or DSL is described as the selected page Sel. PG in FIGS. 7, 8, and 12 to 14. Selected memory cells of the selected page Sel. PG may be programmed into a first program state, and then, a soft erase operation may be performed thereon.

Figure 5:
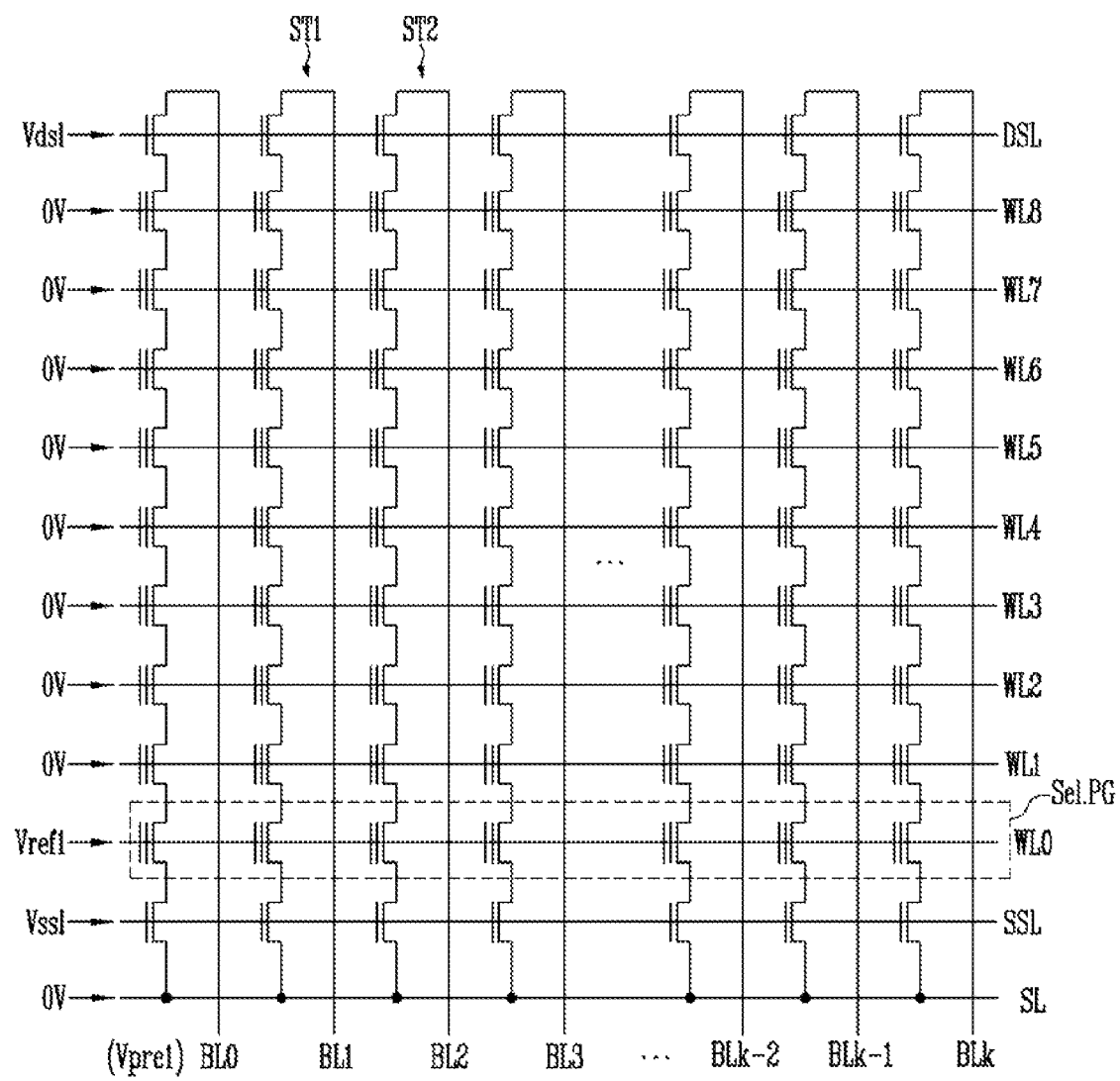
FIG. 5 is a view illustrating a program operation according to an embodiment of the present invention.

Referring to FIGS. 5 and 9, when the soft erase operation of the selected page Sel. PG starts, a first precharge voltage Vpre1 may be applied to the bit lines BL0 to BLk. A ground voltage 0V may be applied to the common source line SL, and a drain turn-on voltage Vdsl and a source turn-on voltage Vssl may be applied to the drain selection line DSL and the source selection line SSL, respectively. While the first reference voltage Vref1 may be applied to the 0th word line WL0 coupled to the selected page Sel. PG, the ground voltage 0V may be applied to the first to eighth word lines WL1 to WL8.

The first reference voltage Vref1 may be the maximum voltage in the threshold voltage distribution of the first program state. The first precharge voltage Vpre1 may be set to a voltage which is greater than the ground voltage 0V and lower than the first reference voltage Vref1. For example, when the threshold voltage having the first program state is distributed between 2.0V and 3.3V, the first reference voltage Vref1 may be set to 3.0V, which is lower than 3.3V, and the first precharge voltage Vpre1 may be set to 2.3V. By performing the soft erase operation, the threshold voltages of the memory cells, which are distributed between 3.0V and 3.3V, may be reduced lower than 3.0V. In addition, the drain and source turn-on voltages Vdsl and Vssl may be set to 5V.

Since the memory cells coupled to the first to eighth word lines WL1 to WL8 are in an erase state, a channel CH may be formed on a surface of a substrate 91. When a drain selection transistor is turned on by the drain turn-on voltage Vdsl, the first precharge voltage Vpre1 applied to the bit line BL may be transferred to a cell string ST along/through the channel CH. A channel voltage Vch may be determined by a threshold voltage of a memory cell included in the selected page Sel. PG. It is described below as an example that a threshold voltage of a memory cell included in the selected page Sel. PG of the first cell string ST1 is higher than the first reference voltage Vref1 and a threshold voltage of a memory cell included in the selected page Sel. PG of the second cell string ST2 is lower than the first reference voltage Vref1.

Since the threshold voltage of the memory cell included in the selected page Sel. PG in the first string ST1 is higher than the first reference voltage Vref1, the channel CH may not be formed under the memory cell. Therefore, in the first cell string ST1, even when the source selection transistor is turned on by applying the source turn-on voltage Vssl to the source selection line SSL, the channel CH may not be formed under the common source line SL to which the ground voltage 0V is applied. Therefore, in the first cell string ST1, the channel CH may be formed from the selected page Sel. PG to the bit line BL. Since the bit line BL and the channel CH are electrically connected to each other, the channel voltage Vch may be the first precharge voltage Vpre1.

In the second string ST2, since the threshold voltage of the memory cell included in the selected page Sel. PG is lower than the first reference voltage Vref1, the channel CH may be formed under the memory cell. Therefore, in the second cell string ST2, the channel CH may be formed between the bit line BL and the common source line SL. Therefore, in the second cell string ST2, a current path may be formed between the common source line SL to which the ground voltage 0V is applied and the bit line BL. As a result, the channel voltage Vch may be the ground voltage 0V.

As described above, even when the first reference voltage Vref1 is applied to the selected page Sel. PG, the channel voltages Vch may vary depending on threshold voltages of memory cells included in the selected page Sel. PG.

Figure 6:
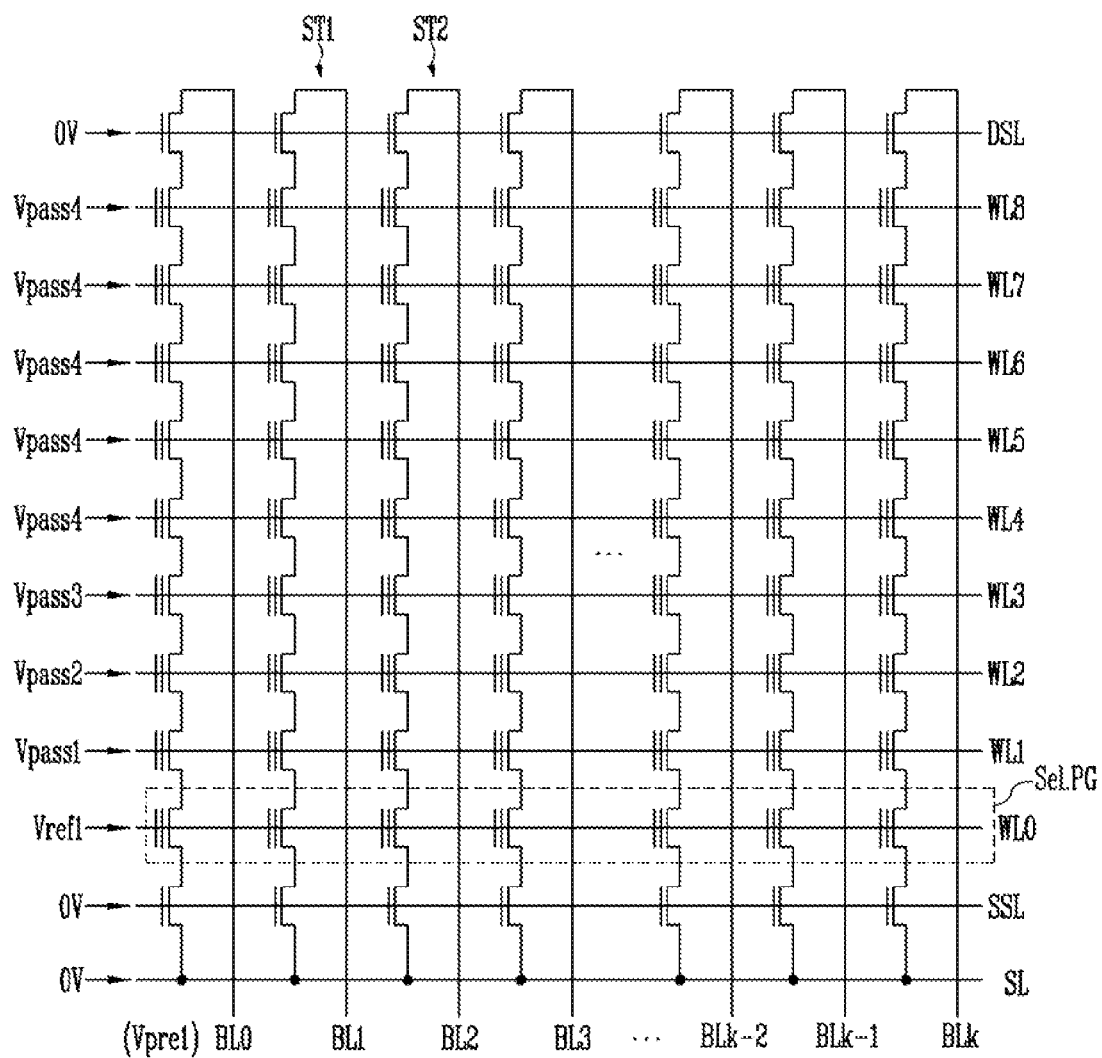
FIG. 6 is a view illustrating a program operation according to an embodiment of the present invention.
Figure 10:
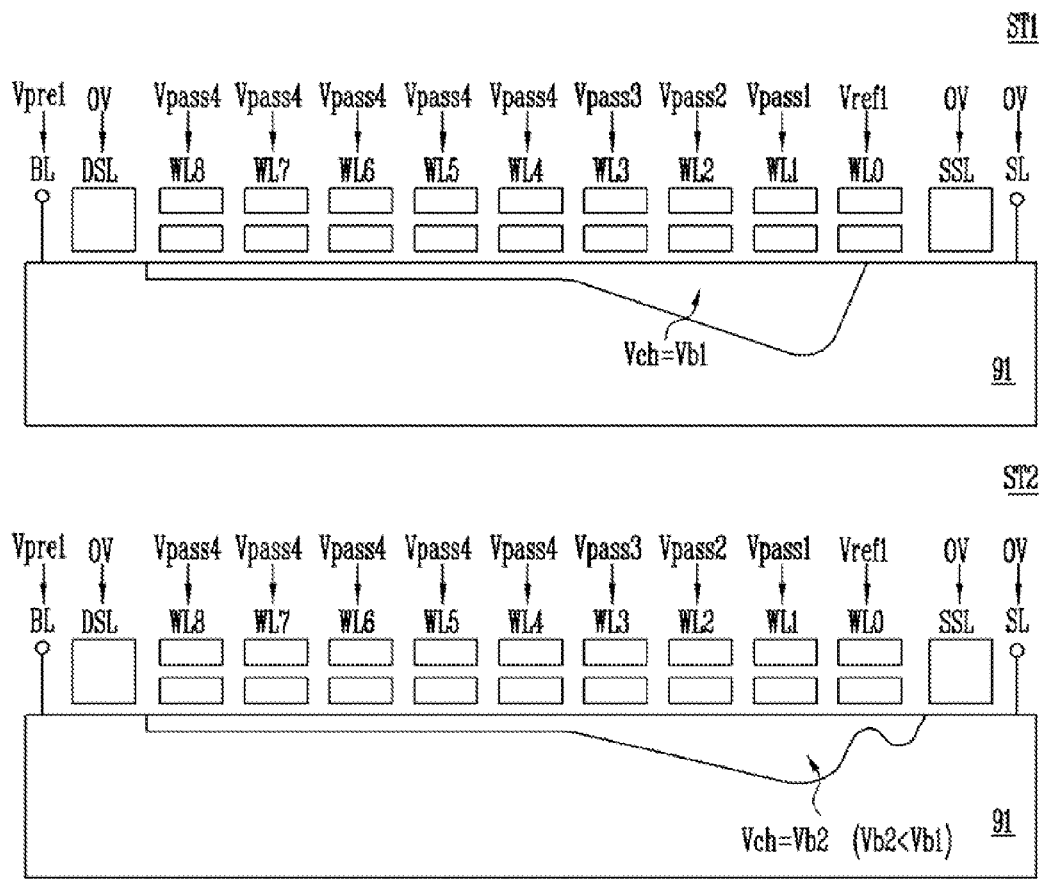
FIG. 10 is a view illustrating changes in a channel when a program operation is performed according to an embodiment of the present invention.

Referring to FIGS. 6 and 10, when the channel voltage Vch is determined by the threshold voltage of the memory cell, the channel voltage Vch may be increased by performing a channel boosting operation.

The channel boosting operation is performed as follows. The first precharge voltage Vpre1, the ground voltage 0V, and the first reference voltage Vref1 may continue to be applied to the bit lines BL0 to BLk, the common source line SL, and the 0th word line WL0, respectively. The ground voltage 0V may be applied to the drain selection line DSL and the source selection line SSL to turn off the drain selection transistor and the source selection transistor, and first to fourth pass voltages Vpass1 to Vpass4 may be applied to the first to eighth word lines WL1 to WL8.

The pass voltages Vpass1 to Vpass4 may be applied to the first to eighth word lines WL1 to WL8 coupled to unselected pages, depending on the distance from the selected page Sel. PG. More specifically, the highest pass voltage may be applied to a word line adjacent to the selected page Sel. PG. The further a word line is away from the selected page Sel. PG, the lower the pass voltage applied to the word line may be. For example, the first pass voltage Vpass1 which is the highest voltage, among the first to fourth pass voltages Vpass1 to Vpass4, may be applied to the first word line WL1 adjacent to the selected page Sel. PG. The second pass voltage Vpass2 lower than the first pass voltage Vpass1 may be applied to the second word line WL2 adjacent to the first word line WL1. The third pass voltage Vpass3 lower than the second pass voltage Vpass2 may be applied to the third word line WL3 adjacent to the second word line WL2. The fourth pass voltage Vpass4, lower than the third pass voltage Vpass3, may be applied to the fourth to eighth word lines WL4 to WL8.

The first to fourth pass voltages Vpass1 to Vpass4 may be set to a level greater than the ground voltage 0V and lower than the program voltage Vpgm. For example, the first pass voltage Vpass1 may be set to 15V, and the second pass voltage Vpass2 may be set to 12V, and the third pass voltage Vpass3 may be set to 10V, and the fourth pass voltage Vpass4 may be set to 7V. The first to fourth pass voltages Vpass1 to Vpass4 are set for a simplified explanation. The number of pass voltages having different voltages levels and voltages levels may vary depending on the particular semiconductor device application.

As described above, when the first to fourth pass voltages Vpass1 to Vpass4 having a positive voltage level are applied to unselected word lines WL1 to WL8 with the drain and source selection transistors turned off, channel boosting may occur in the first and second cell strings ST1 and ST2.

However, a voltage difference may occur between the channel voltage Vch of the first cell string ST1 and the channel voltage Vch of the second cell string ST2, depending on the threshold voltages of the memory cells included in the selected page Sel. PG.

In the first cell string ST1, since the highest first pass voltage Vpass1 is applied to the first word line WL1 when the channel CH is formed only under the first to eighth word lines WL1 to WL8, the channel voltage (Vch) of the first word line WL1 adjacent to the selected page Sel. PG may be the highest voltage due to channel boosting. The highest channel voltage Vch in the first string ST1 may be defined as a first boosting voltage Vb1. For example, when the first pass voltage Vpass1 applied to the first word line WL1 is 15V, the first boosting voltage Vb1 may be increased to at least 17V. A potential difference between the memory cell of the selected page Sel. PG and the channel CH may be increased by the first boosting voltage Vb1 to cause current leakage. Thus, a soft erase operation may be performed on the memory cell of the selected page Sel. PG.

The soft erase operation is described with reference to FIG. 11.

Figure 11:
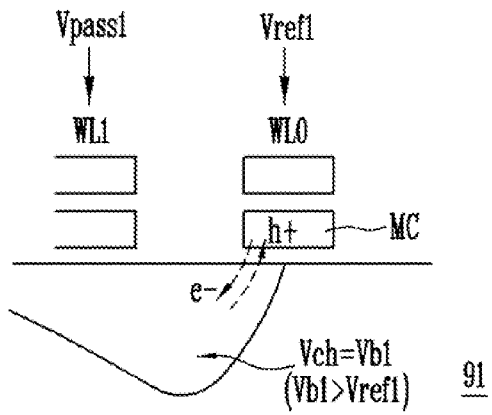
FIG. 11 is a view illustrating changes in a channel when a program operation is performed according to an embodiment of the present invention.

Referring to FIG. 11, when the channel voltage Vch of the substrate 91 adjacent to the 0th word line WL0 is increased to the first boosting voltage Vb1 higher than the first reference voltage Vref1 (Vb1>Vref1), a current path may be formed between a memory cell MC and the channel CH. Positive charges h+ of the channel CH may move to the memory cell MC, and negative charges e− of the memory cell MC may move to the channel CH. As described above, when the negative charges e− of the memory cell MC move to the channel CH, the threshold voltage of the memory cell MC may be reduced, so that the soft erase operation may be performed.

Referring again to FIG. 10, as described above, a soft erase operation may be performed on the memory cell coupled to the 0th word line WL0 of the first cell string ST1. On the other hand, since the memory cell coupled to the 0th word line WL0 of the second cell string ST2 has a lower threshold voltage than the first reference voltage Vref1, the soft erase operation may not be performed. Since the channel CH is formed under the memory cell included in the selected page Sel. PG of the second cell string ST2, as shown in FIG. 9, the channel voltage Vch may be dispersed/released to the substrate 91 on which the source selection line SSL is formed, even when channel boosting occurs in the second cell string ST2. In other words, the channel voltage Vch of the second cell string ST2 may be lower than the channel voltage Vch of the first cell string ST1 before channel boosting occurs. In addition, even when channel boosting occurs, the channel voltage Vch is dispersed at both ends of the selected memory cell in the second cell string ST2, and the channel voltage Vch may not be increased enough to perform the soft erase operation. In other words, when the maximum channel voltage Vch of the second cell string ST2 increases to a second boosting voltage Vb2, the second boosting voltage Vb2 may be lower than the first boosting voltage Vb1(Vb2<Vb1). For example, when the first boosting voltage Vb1 increases to 17V, the second boosting voltage Vb2 may increase to 14V. As described above, a potential difference between the second boosting voltage Vb2 and the memory cell coupled to the 0th word line WL0 does not reach a predetermined level or higher, and the negative charges e− of the memory cell may not move. Thus, the soft erase operation may not be performed.

After the program operation is performed to program selected memory cells of the selected page Sel. PG into the first program state by using the above-described method, the width of the threshold voltage distribution of the memory cells having the first program state may be reduced by performing the soft erase operation. Subsequently, other selected memory cells in the same page may be programmed into a second program state and a third program state by using a substantially similar method. When the selected memory cells are programmed into the second program state and a soft erase operation is performed thereon, the second reference voltage Vref2 higher than the first reference voltage Vref1 and a second precharge voltage Vpre2 higher than the first precharge voltage Vpre1 may be used. In addition, when the selected memory cells are programmed into the third program state and a soft erase operation is performed thereon, the third reference voltage Vref3 higher than the second reference voltage Vref2 and a third precharge voltage Vpre3 higher than the second precharge voltage Vref2 may be used. When the selected memory cells are programmed into the second program state and the third program state, and the soft erase operations are performed thereon, the same first to fourth pass voltages Vpass1 to Vpass4 may be used.

A soft erase operation of a page not adjacent to the source or drain selection lines SSL or DSL is described below.

Figure 7:
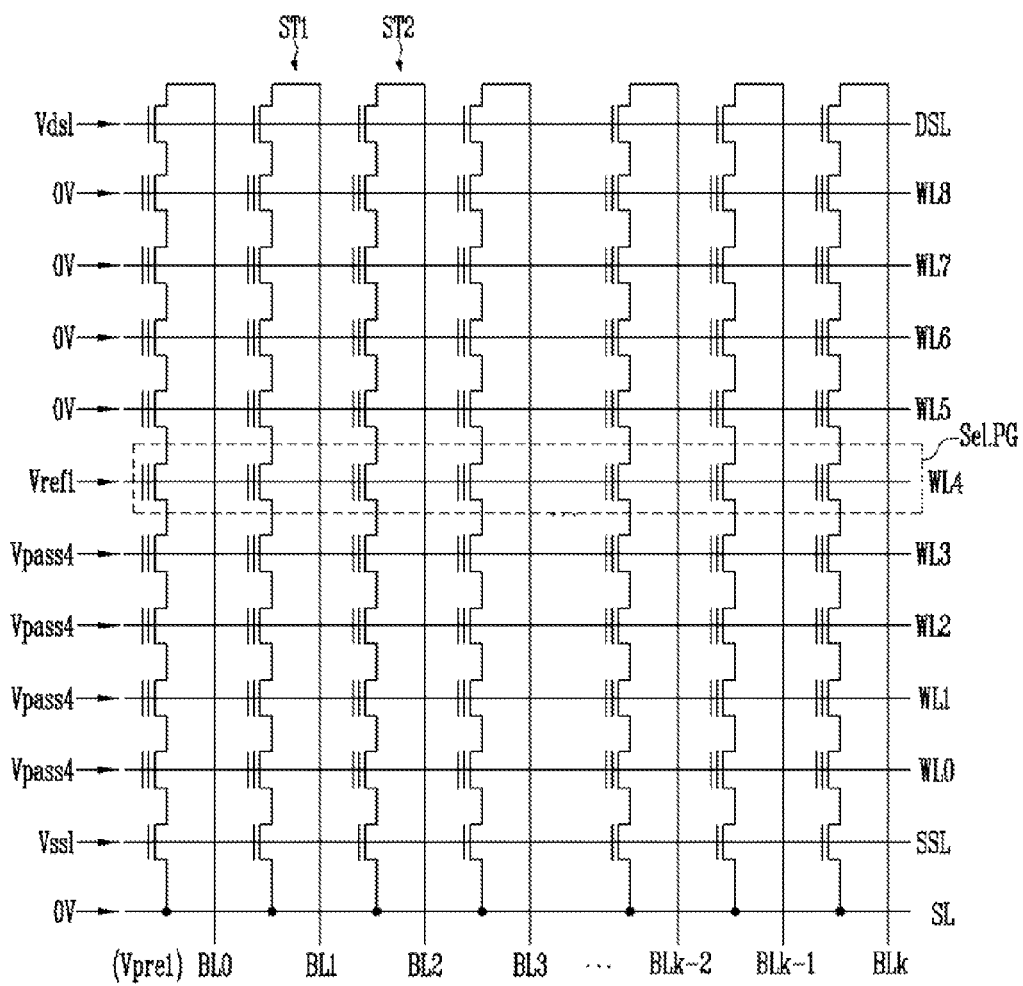
FIG. 7 is a view illustrating a program operation according to an embodiment of the present invention.

Referring to FIGS. 7 and 12, when the soft erase operation of the selected page Sel. PG starts, the first precharge voltage Vpre1 may be applied to the bit lines BL0 to BLk, a ground voltage 0V may be applied to the common source line SL, and the drain turn-on voltage Vdsl and the source turn-on voltage Vssl may be applied to the drain selection line DSL and the source selection line SSL, respectively. While the first reference voltage Vref1 may be applied to the fourth word line WL4 coupled to the selected page Sel. PG, the fourth pass voltage Vpass4 may be applied to the unselected 0th to third word lines WL0 to WL3, and the ground voltage 0V may be applied to the unselected fifth to eighth word lines WL5 to WL8. Since the program operation is performed in the order from a page adjacent to the source selection line SSL to a page adjacent to the drain selection line DSL, the program operation of the pages coupled to the 0th to third word lines WL0 to WL3 may be completed. Thus, the fourth pass voltage Vpass4 may be applied to the unselected 0th to third word lines WL0 to WL3.

The first reference voltage Vref1 may be the maximum voltage to be set in the threshold voltage distribution of the first program state. The first precharge voltage Vpre1 may be higher than the ground voltage 0V and lower than first reference voltage Vref1. For example, when the threshold voltage having the first program state is distributed between 2.0V and 3.3V, the first reference voltage Vref1 may be set to 3.0V, which is lower than 3.3V. In this manner, the threshold voltages of the memory cells which are distributed between 3.0V and 3.3V may be reduced lower than 3.0V by performing the soft erase operation. The fourth pass voltage Vpass4 may be set to a voltage to form the channel CH. For example, the fourth pass voltage Vpass4 may be set to 7V.

Since the memory cells coupled to the fifth to eighth word lines WL5 to WL8 have an erase state, the channel CH may be formed on a surface of the substrate 91. When the drain selection transistor is turned on by the drain turn-on voltage Vdsl, the first precharge voltage Vpre1 applied to the bit line BL may be transferred to a cell string ST along the channel CH. The channel voltage Vch may be determined by the threshold voltage of the memory cell included in the selected page Sel. PG. It is described as an example that the threshold voltage of the memory cell included in the selected page Sel. PG of the first cell string ST1 may be higher than the first reference voltage Vref1, and the threshold voltage of the memory cell included in the selected page Sel. PG of the second cell string ST2 may be lower than the first reference voltage Vref1.

Since the threshold voltage of the memory cell included in the selected page Sel. PG is greater than the first reference voltage Vref1 in the first string ST1, the channel CH may not be formed under the corresponding memory cell. Therefore, even when the fourth pass voltage Vpass4 is applied to the 0th to third word lines WL0 to WL3, the channel voltage Vch applied to the substrate 91 adjacent to the fifth to eighth word lines WL5 to WL8 may not be transferred to the substrate 91 adjacent to the 0th to fourth word lines WL0 to WL4. Therefore, even when the source turn-on voltage Vssl is applied to the source selection line SSL to turn on the source selection transistor in the first cell string ST1, the channel CH may not be formed under the common source line SL to which the ground voltage 0V is applied. Therefore, the channel CH may be formed in the first cell string ST1 from the selected page Sel. PG to the bit line BL, and the bit line BL and the channel CH may be electrically coupled to each other, so that the channel voltage Vch may be the first precharge voltage Vpre1.

Since the threshold voltage of the memory cell included in the selected page Sel. PG is lower than the first reference voltage Vref1 in the second string ST2, the channel CH may be formed under the corresponding memory cell. Therefore, in the second cell string ST2, the channel CH may be formed between the bit line BL and the common source line SL. As a result, in the second cell string ST2, a current path may be formed between the common source line SL to which the ground voltage 0V is applied and the bit line BL, so that the channel voltage Vch may be the ground voltage 0V.

As described above, even when the first reference voltage Vref1 is applied to the selected page Sel. PG, the channel voltages Vch may vary depending on the threshold voltages of the memory cells included in the cell strings ST1 and ST2.

Figure 8:
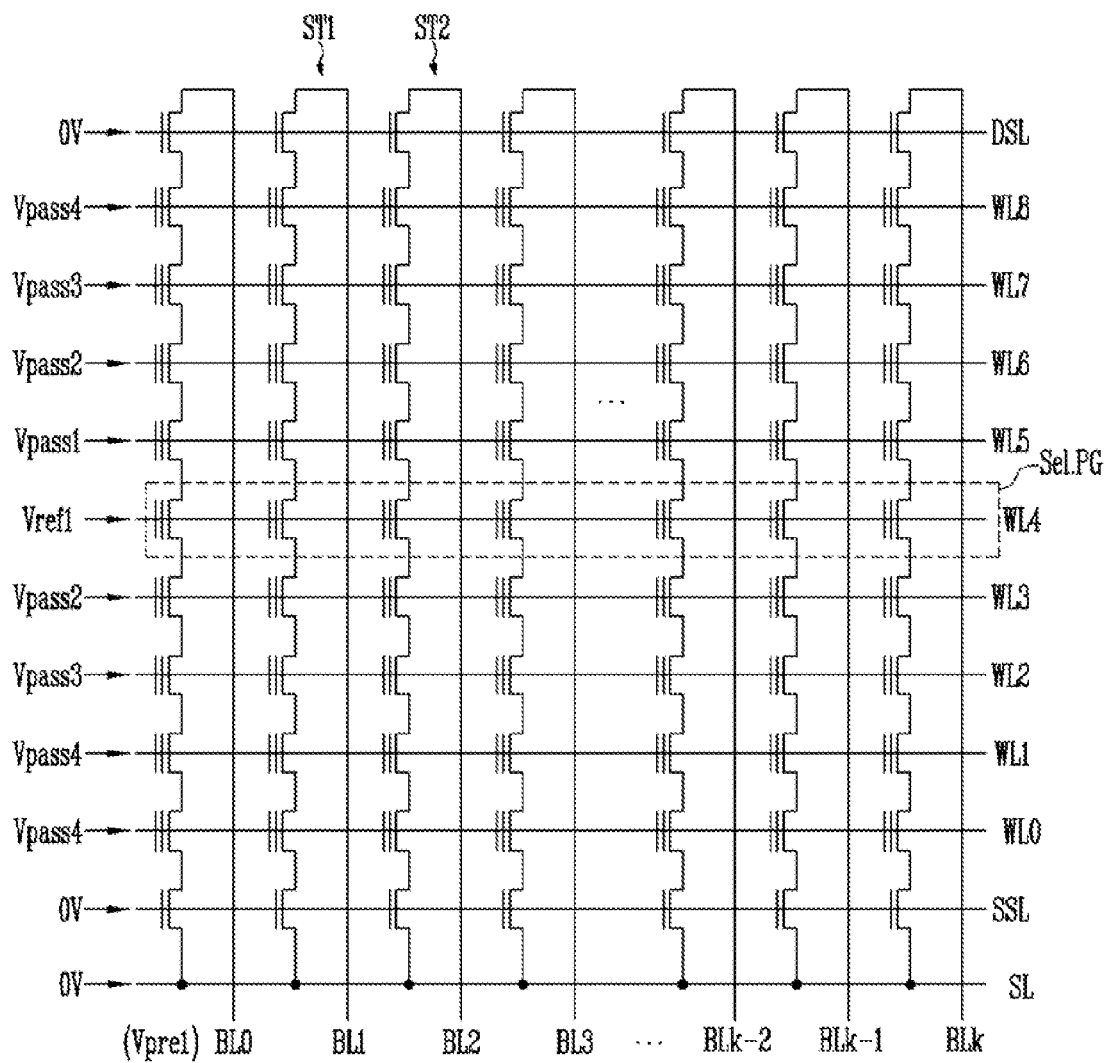
FIG. 8 is a view illustrating a program operation according to an embodiment of the present invention.
Figure 13:
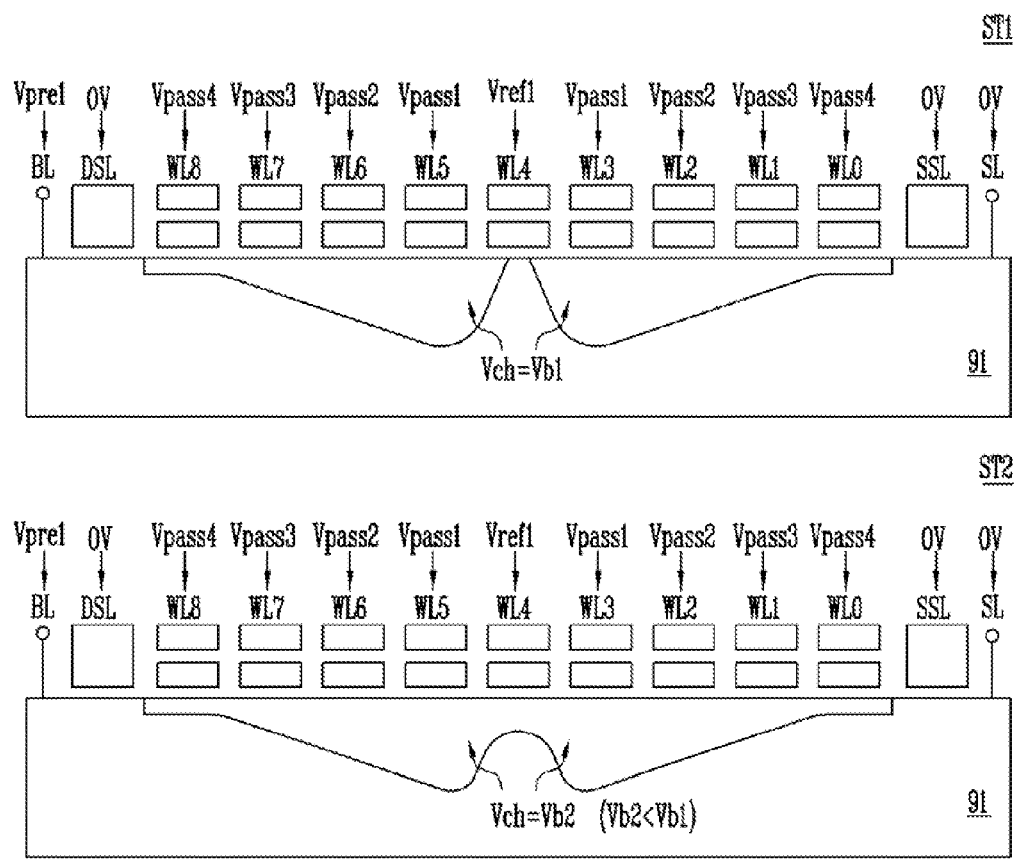
FIG. 13 is a view illustrating changes in a channel when a program operation is performed according to an embodiment of the present invention.

Referring to FIGS. 8 and 13, when the channel voltage Vch is determined by the threshold voltage of the memory cell, the channel voltage Vch may be increased by performing a channel boosting operation.

The channel boosting operation may be performed as follows.

The first precharge voltage Vpre1, the ground voltage 0V, and the first reference voltage Vref1 may continue to be applied to the bit lines BL0 to BLk, the common source line SL, and the fourth word line WL4, respectively, and the ground voltage 0V may be applied to the drain selection line DSL and the source selection line SSL, so that the drain selection transistor and the source selection transistor may be turned off. The first to fourth pass voltages Vpass1 to Vpass4 may be applied to the unselected 0th to third word lines WL0 to WL3 and the fifth to eighth word lines WL5 to WL8.

The pass voltages Vpass1 to Vpass4 may be applied to the 0th to third word lines WL0 to WL3 and the fifth to eighth word lines WL5 to WL8 coupled to the unselected pages except for the selected page Sel. PG, depending on the distance from the selected page Sel. PG. More specifically, the highest pass voltage may be applied to the word lines adjacent to the selected page Sel. PG. The further a word line is away from the selected page Sel. PG, the lower the pass voltage that may be applied to the word line.

For example, the first pass voltage Vpass1, which is the highest voltage among the first to fourth pass voltages Vpass1 to Vpass4, may be applied to the third and fifth word lines WL3 and WL5 adjacent to the selected page Sel. PG.

The second pass voltage Vpass2 lower than the first pass voltage Vpass1 may be applied to the second and sixth word lines WL2 and WL6 adjacent to the third and fifth word lines WL3 and WL5, respectively. The third pass voltage Vpass3 lower than the second pass voltage Vpass2 may be applied to the first and seventh word lines WL1 and WL7 adjacent to the second and sixth word lines WL2 and WL6, respectively. The fourth pass voltage Vpass4 lower than the third pass voltage Vpass3 may be applied to the 0th and eighth word lines WL0 and WL8 adjacent to the first and seventh word lines WL1 and WL7, respectively. The first to fourth pass voltages Vpass1 to Vpass4 may be greater than the ground voltage 0V and lower than the program voltage Vpgm. For example, the first pass voltage Vpass1 may be set to 15V, and the second pass voltage Vpass2 may be set to 12V, and the third pass voltage Vpass3 may be set to 10V, and the fourth pass voltage Vpass4 may be set to 7V. The first to fourth pass voltages Vpass1 to Vpass4 are set for simplified explanation. The number of pass voltages and the voltage levels thereof may vary depending on the particular semiconductor device application.

As described above, when the first to fourth pass voltages Vpass1 to Vpass4 having a positive voltage level are applied to the unselected word lines WL0 to WL3 and WL5 to WL8 while the drain and source selection transistors are turned off, channel boosting may occur in the first and second cell strings ST1 and ST2. However, the threshold voltages of the memory cells included in the selected page Sel. PG may cause a voltage difference between the channel voltage Vch of the first cell string ST1 and the channel voltage Vch of the second cell string ST2.

Since the first pass voltage Vpass1, which is the highest voltage, is applied to the third and fifth word lines WL3 and WL5 in the first cell string ST1, the channel voltage (Vch) of the third and fifth word lines WL3 and WL5 adjacent to the selected page Sel. PG may be the highest voltage by channel boosting. The highest channel voltage Vch in the first string ST1 may be defined as the first boosting voltage Vb1. For example, when the first pass voltage Vpass1 applied to the third and fifth word lines WL3 and WL5 is 15V, the first boosting voltage Vb1 may be increased to at least 17V. The potential difference between the memory cell of the selected page Sel. PG and the channel CH increased by the first boosting voltage Vb1 may be increased to generate leakage current. Thus, the soft erase operation may be performed on the memory cell of the selected page Sel. PG.

Figure 14:
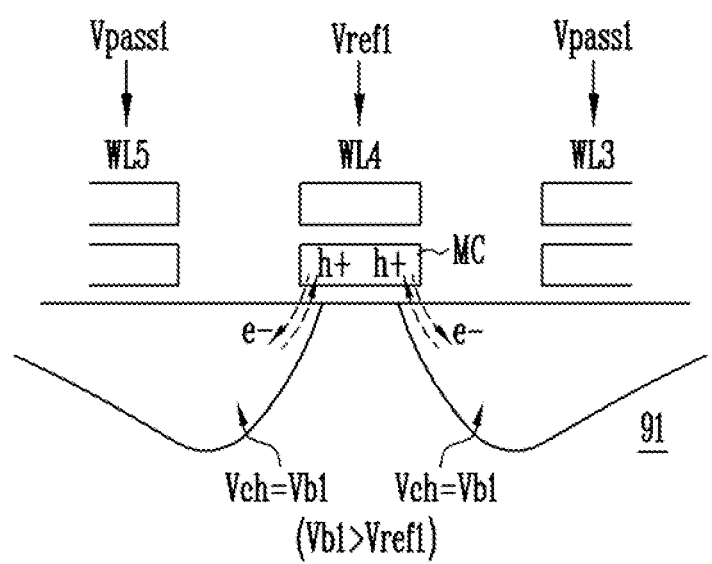
FIG. 14 is a view illustrating changes in a channel when a program operation is performed according to an embodiment of the present invention.

FIG. 14 is a view illustrating a soft erase operation.

Referring to FIG. 14, when the channel voltage Vch of the substrate 91 adjacent to the fourth word line WL5 increases to the first boosting voltage Vb1 higher than the first reference voltage Vref1 (Vb1>Vref1), a current path may be formed between the memory cell MC and the channel CH. The positive charges h+ of the channel CH may move to the memory cell MC, and the negative charges e− of the memory cell MC may move to the channel CH. As described above, when the negative charges e− of the memory cell MC move to the channel CH, the threshold voltage of the memory cell MC may be reduced and the soft erase operation may be performed.

Referring again to FIG. 13, as described above, the soft erase operation may be performed on the memory cell coupled to the fourth word line WL4 of the first cell string ST1. On the other hand, since the memory cell coupled to the fourth word line WL4 of the second cell string ST2 has a lower threshold voltage than the first reference voltage Vref1, the soft erase operation may not be performed thereon. Since the channel CH is formed under the memory cell included in the selected page Sel. PG of the second cell string ST2, as shown in FIG. 12, the channel voltage Vch may be dispersed/released to the substrate 91 on which the source selection line SSL is formed, even when channel boosting occurs in the second cell string ST2. In other words, the channel voltage Vch of the second cell string ST2 is lower than the channel voltage Vch of the first cell string ST1 before channel boosting occurs. In addition, even when channel boosting occurs, the channel voltage Vch may be dispersed at both ends of the selected memory cell in the second cell string ST2, and the channel voltage Vch may not be increased enough to perform the soft erase operation. For example, when the first boosting voltage Vb1 increases to 17V, the second boosting voltage Vb2 may increase to 14V. As described above, when the potential difference between the second boosting voltage Vb2 and the memory cell coupled to the fourth word line WL4 does not reach a predetermined level or higher, the negative charges e− of the memory cell may not move. Thus, the soft erase operation may not be performed.

After the program operation is performed by using the above-described method so that the selected memory cells of the selected page Sel. PG may have the first program state, the width of the threshold voltage distribution of the memory cells having the first program state may be reduced by performing the above-described soft erase operation. Subsequently, other selected memory cells in the same page may be programmed into the second program state and the third program state by using a substantially similar method. When the selected memory cells are programmed into the second program state, and a soft erase operation is performed thereon, the second reference voltage Vref2, higher than the first reference voltage Vref1, and the second precharge voltage Vpre2, higher than the first precharge voltage Vpre1, may be used. In addition, when the selected memory cells are programmed into the third program state, and the soft erase operation is programmed, the third reference voltage Vref3, higher than the second reference voltage Vref2, and the third precharge voltage Vpre3, higher than the second precharge voltage Vref2, may be used. When the selected memory cells are programmed into the second program state and the third program state, and the soft erase operations are performed thereon, the same first to fourth pass voltages Vpass1 to Vpass4 may be used.

As described above, by performing the program operation and the soft erase operation on the selected memory cells of the remaining pages, the program operation of the selected memory block may be completed. By performing the soft erase operation, the width of the threshold voltage distribution of each program state may be reduced, so that a margin in the interval between threshold voltage distributions may be ensured. Accordingly, reliability of semiconductor devices may be improved.

Figure 15:
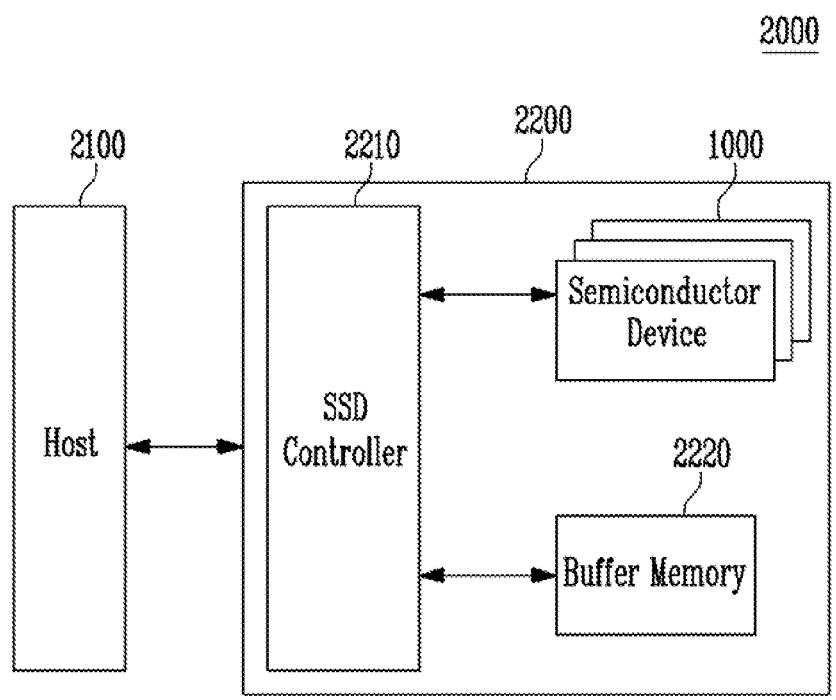
FIG. 15 is a block diagram illustrating a solid state drive including a semiconductor device according to an embodiment of the present invention.

FIG. 15 is a block diagram illustrating a solid state drive (SSD) including a semiconductor device according to an embodiment of the present invention.

Referring to FIG. 15, a drive device 2000 may include a host 2100 and an SSD 2200. The SSD 2200 may include an SSD controller 2210, a buffer memory 2220 and a semiconductor device 1000.

The SSD controller 2210 may provide a physical connection between the host 2100 and the SSD 2200. In other words, the SSD controller 2210 may function as an interface between the SSD 2200 and the host 2100 in response to the bus format of the host 2100. The SSD controller 2210 may decode a command provided from the host 2100. Based on a decoding result, the SSD controller 2210 may access the semiconductor device 1000. As the bus format of the host 2100, universal serial bus (USB), small computer system interface (SCSI), peripheral component interconnect express (PCI-E), advanced technology attachment (ATA), parallel ATA (PATA), serial ATA (SATA), and serial attached SCSI (SAS) may be included.

The buffer memory 2220 may temporarily store program data provided from the host 2100 or data read from the semiconductor device 1000. If data in the semiconductor device 1000 is cached at a read request of the host 2100, the buffer memory 2220 may support a cache function to directly provide the cached data to the host 2100. In general, the data transfer speed of the bus format (for example, SATA or SAS) of the host 2100 may be higher than that of a memory channel of the SSD 2200. In other words, when an interface speed of the host 2100 is higher than the transfer speed of the memory channel of the SSD 2200, performance degradation caused by the speed difference may be minimized by providing a buffer memory 2220 having a large capacity. The buffer memory 2220 may be provided as Synchronous DRAM in order to provide sufficient buffering in the SSD 2200.

The semiconductor device 1000 may be provided as a storage medium of the SSD 2200. For example, the semiconductor device 1000 may be provided as a nonvolatile memory device having large storage capacity as described above in detail with reference to FIG. 1. The semiconductor device 1000 may be a NAND-type flash memory.

Figure 16:
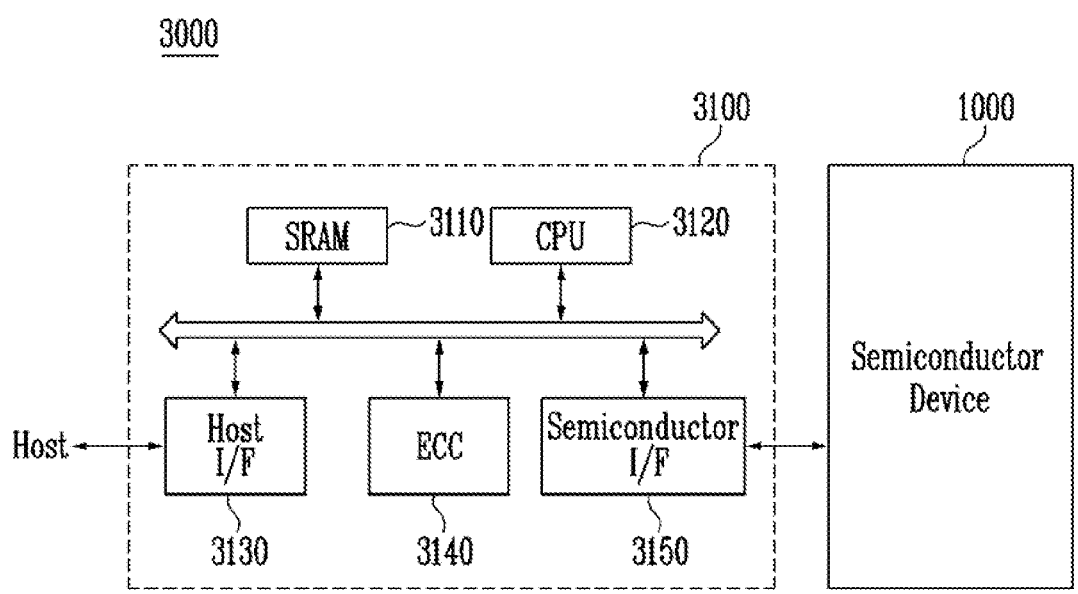
FIG. 16 is a block diagram illustrating a memory system including a semiconductor device according to an embodiment of the present invention.

FIG. 16 is a block diagram illustrating a memory system including a semiconductor device according to an embodiment of the present invention.

Referring to FIG. 16, a memory system 3000 according to an embodiment may include a memory control unit 3100 and a semiconductor device 1000.

Since the semiconductor device 1000 may have substantially the same configuration as shown in FIG. 1. Therefore, a detailed description thereof is omitted.

The memory control unit 3100 may be configured to control the semiconductor device 1000. A static random access memory (SRAM) 3110 may be used as a working memory of a central processing unit (CPU) 3120. A host interface (I/F) 3130 may include a data exchange protocol of a host electrically coupled with the memory system 3000. An error correction circuit (ECC) 3140 in the memory control unit 3100 may detect and correct an error in data read from the semiconductor device 1000. A semiconductor I/F 3150 may interface with the semiconductor device 1000. The CPU 3120 may perform a control operation for data exchange of the memory control unit 3100. In addition, although not illustrated in FIG. 16, a read only memory (ROM) for storing code data for interfacing with a host may be provided in the memory system 3000.

In an embodiment, the memory system 3000 may be applied to one of a computer, an ultra mobile PC (UMPC), a workstation, a net-book, a PDA, a portable computer, a web tablet, a wireless phone, a mobile phone, a smartphone, a digital camera, a digital audio recorder, a digital audio player, a digital picture recorder, a digital picture player, a digital video recorder, a digital video player, a device of transmitting and receiving information in a wireless environment, and various devices constituting a home network.

Figure 17:
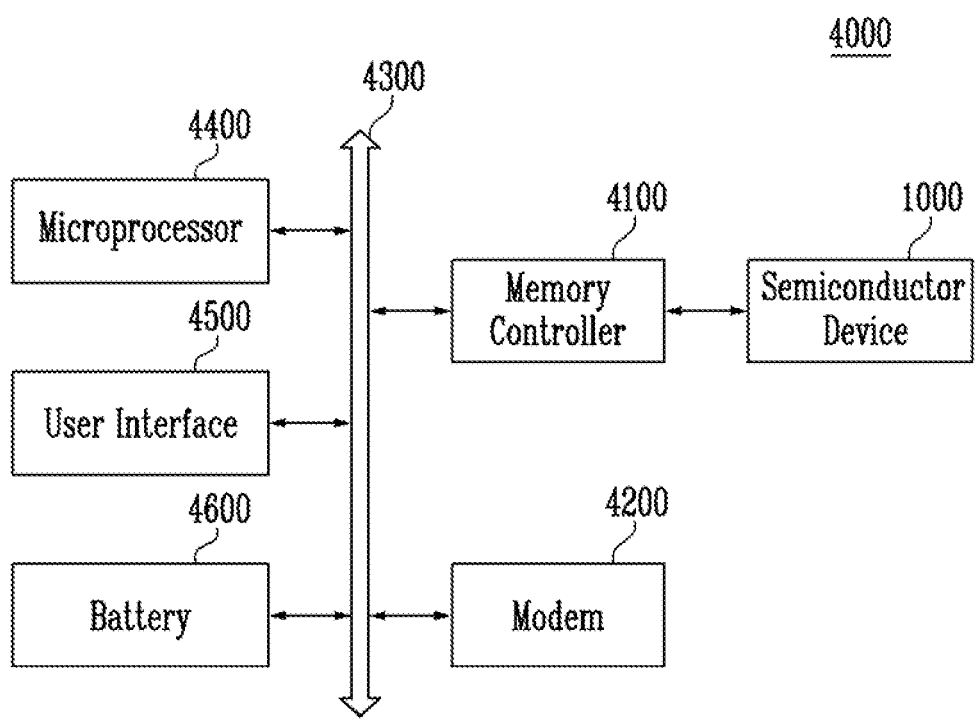
FIG. 17 is a view illustrating the configuration of a computing system including a semiconductor device according to an embodiment of the present invention.

FIG. 17 is a block diagram illustrating a computing system 4000 including a semiconductor device according to an embodiment of the present invention.

Referring to FIG. 17, the computing system 4000 includes a semiconductor device 1000, a memory controller 4100, a modem 4200, a microprocessor 4400, and a user interface 4500, which are electrically coupled to a bus 4300. When the computing system 4000 is a mobile device, a battery 4600 for supplying an operation voltage of the computing system 4000 may be additionally provided. The computing system 4000 may include an application chip set (not shown), a camera image processor (CIS) (not shown), a mobile DRAM (not shown), and the like.

The semiconductor device 1000 may be configured in substantially the same manner as the semiconductor device 1000 shown in FIG. 1. Thus, a detailed description thereof will be omitted.

The memory controller 4100 and the semiconductor device 1000 may be components of a Solid State Drive/Disk (SSD).

The semiconductor device 1000 and the memory controller 4100 may be mounted using various types of packages. For example, the semiconductor device 1000 and the memory controller 4100 may be mounted using packages such as package on package (PoP), ball grid array (BGA), chip scale package (CSP), plastic leaded chip carrier (PLCC), plastic dual in-line package (PDIP), die in waffle package, die in wafer form, chip on board (COB), ceramic dual in-line package (CERDIP), plastic metric quad flat package (MQFP), thin quad flat package (TQFP), small outline integrated circuit (SOIC), shrink small outline package (SSOP), thin small outline package (TSOP), system in package (SIP), multi chip package (MCP), wafer-level fabricated package (WFP), wafer-level processed stack package (WSP), and the like.

According to the present invention, when a program operation is performed, the threshold voltage distribution width of memory cells may be reduced, so that margin may be ensured in the interval between threshold voltage distributions corresponding to different program states. Accordingly, reliability of a semiconductor device may be improved.

What is claimed is:

1. A method of operating a semiconductor device, the method comprising:
   performing a program operation on selected memory cells of a selected page;
   selectively performing a soft erase operation on memory cells having threshold voltages greater than a reference voltage, among the selected memory cells, to reduce a width of a threshold voltage distribution of the selected memory cells; and
   applying pass voltages to unselected word lines coupled to unselected pages when the soft erase operation is performed.

2. The method of claim 1, wherein the program operation is performed by an incremental step pulse program (ISPP) method.

3. The method of claim 1, wherein the reference voltage is applied to a selected word line coupled to the selected page when the pass voltages are applied to the unselected word lines.

4. The method of claim 3, wherein a highest pass voltage, among the pass voltages, is applied to the unselected word lines adjacent to the selected word line, and as an unselected page is further away from the selected page, a lower pass voltage is applied to the unselected word lines.

5. The method of claim 1, wherein the program operation and the soft erase operation are performed each time the selected memory cells of the selected page are programmed into different program states.

6. A method of operating a semiconductor device, the method comprising:
   programming selected memory cells, among a plurality of memory cells formed between first selection transistors and second selection transistors on a substrate, wherein threshold voltages of the selected memory cells have higher levels than a target level;
   forming channels on the substrate; and
   selectively increasing potential differences between voltages of the channels and the threshold voltages of the selected memory cells to reduce threshold voltages of memory cells that have higher level than a reference level, among programmed memory cells.

7. The method of claim 6, wherein the programming of the selected memory cells is performed by an incremental step pulse program (ISPP) method.

8. The method of claim 6, wherein the memory cells are selected and programmed in the order from memory cells adjacent to the second selection transistors to memory cells adjacent to the first selection transistors.

9. The method of claim 6, wherein the forming of the channels on the substrate comprises:
   applying a precharge voltage to bit lines coupled to drains of the first selection transistors and a ground voltage to a common source line coupled to sources of the second selection transistors;
   applying a reference voltage to a selected word line coupled to gates of the selected memory cells and applying a pass voltage to unselected word lines except for the selected word line; and
   applying a turn-on voltage to first and second selection lines coupled to gates of the first and second selection transistors.

10. The method of claim 9, wherein a pass voltage of 0V is applied to word lines, arranged between the selected word line and the first selection line, among the unselected word lines, and
   a pass voltage having a positive voltage level is applied to word lines, arranged between the selected word line and the second selection line, among the unselected word lines.

11. The method of claim 9, wherein the reference voltage is set between the precharge voltage and the pass voltage, and
   the precharge voltage is set to a voltage greater than 0V.

12. The method of claim 6, wherein the selectively increasing of the potential differences between the channels and the selected memory cells comprises:
   applying a reference voltage to a selected word line coupled to gates of the selected memory cells;
   applying a pass voltage to unselected word lines except for the selected word line, wherein a highest pass voltage is applied to an unselected word line adjacent to the selected word line, and as an unselected word line is further away from the selected word line, a lower pass voltage is applied to the unselected word line; and
   generating channel boosting by turning off the first and second selection transistors.

13. The method of claim 12, wherein a channel voltage of memory cells having higher threshold voltages than the reference voltage, among the selected memory cells, is boosted to be higher than a channel voltage of memory cells having lower threshold voltages than the reference voltage, and
   the potential differences between the channels and the selected memory cells is selectively increased, wherein a soft erase operation is selectively performed on the memory cells having the higher threshold voltages than the reference voltage.

14. A semiconductor device, comprising:
a memory block including a plurality of cell strings each including a first selection transistor, a plurality of memory cells and a second selection transistor coupled in series between bit lines and a common source line;
a circuit group suitable for performing a program operation and a soft erase operation on the memory block; and
a control circuit suitable for controlling the circuit group to perform the program operation on selected memory cells of a selected page, among a plurality of pages included in the memory block, and selectively performing a soft erase operation on memory cells having greater threshold voltages than a reference voltage, among the selected memory cells, and apply pass voltages to word lines coupled to unselected pages except for the selected page when the program operation is completed.

15. The semiconductor device of claim 14, wherein the control circuit controls the circuit group to perform the program operation by an incremental step pulse program (ISPP) method.

16. The semiconductor device of claim 14, wherein the control circuit controls the circuit group to apply the reference voltage to a word line coupled to the selected page.

17. The semiconductor device of claim 14, wherein the control circuit controls the circuit group to apply a highest pass voltage, among the pass voltages, to word lines coupled to unselected pages adjacent to the selected page and apply lower pass voltages to word lines coupled to unselected pages further away from the selected page.

18. The semiconductor device of claim 16, wherein the control circuit controls the circuit group to selectively perform the soft erase operation on the memory cells having higher threshold voltages than the reference voltage.

19. The semiconductor device of claim 14, wherein the control circuit controls the circuit group to perform the program operation and the soft erase operation each time the selected memory cells of the selected page are programmed into different program states.

20. The semiconductor device of claim 16, wherein the reference voltage is set to be lower than the pass voltages.

* * * * *